United States Patent
Moon

(10) Patent No.: US 8,957,475 B2
(45) Date of Patent: Feb. 17, 2015

(54) BOOTSTRAP FIELD EFFECT TRANSISTOR (FET)

(71) Applicant: Dongbu Hitek Co., Ltd., Seoul (KR)

(72) Inventor: Nam Chil Moon, Bucheon-si (KR)

(73) Assignee: Dongbu HiTek Co., Ltd., Seoul (KR)

( * ) Notice: Subject to any disclaimer, the term of this patent is extended or adjusted under 35 U.S.C. 154(b) by 0 days.

(21) Appl. No.: 13/832,171

(22) Filed: Mar. 15, 2013

(65) Prior Publication Data

US 2014/0264586 A1    Sep. 18, 2014

(30) Foreign Application Priority Data

Mar. 13, 2013 (KR) .................. 10-2013-0026654

(51) Int. Cl.

| | |
|---|---|
| H01L 29/76 | (2006.01) |
| H01L 29/94 | (2006.01) |
| H01L 31/062 | (2012.01) |
| H01L 31/113 | (2006.01) |
| H01L 31/119 | (2006.01) |
| H01L 23/58 | (2006.01) |
| H01L 29/78 | (2006.01) |
| H01L 29/66 | (2006.01) |

(52) U.S. Cl.
CPC ...... *H01L 29/7817* (2013.01); *H01L 29/66681* (2013.01)
USPC .......... 257/335; 257/341; 257/401; 257/492; 257/E29.066; 257/E29.152; 257/E29.187; 257/E29.256; 257/E29.261

(58) Field of Classification Search
USPC .................. 257/335, 341, 401, 492, E29.066, 257/E29.152, E29.187, E29.256, E29.261
See application file for complete search history.

(56) References Cited

U.S. PATENT DOCUMENTS

| | | | |
|---|---|---|---|
| 6,211,552 B1* | 4/2001 | Efland et al. ................... | 257/343 |
| 6,424,005 B1* | 7/2002 | Tsai et al. ..................... | 257/335 |
| 6,475,870 B1* | 11/2002 | Huang et al. .................. | 438/316 |
| 6,911,696 B2* | 6/2005 | Denison ........................ | 257/343 |
| 7,518,209 B2 | 4/2009 | Kim et al. | |
| 7,906,828 B2 | 3/2011 | Kim et al. | |
| 8,358,155 B2* | 1/2013 | Chow et al. ................... | 326/113 |
| 8,704,300 B1* | 4/2014 | Lin et al. ....................... | 257/335 |
| 8,710,587 B2 | 4/2014 | Moon et al. | |
| 8,785,988 B1* | 7/2014 | Chan et al. .................... | 257/262 |

(Continued)

FOREIGN PATENT DOCUMENTS

| | | |
|---|---|---|
| JP | 2006-005182 A | 1/2006 |
| KR | 10-2002-0013218 A | 2/2002 |

(Continued)

OTHER PUBLICATIONS

Office Action dated Feb. 20, 2014 in Korean Application No. 10-2013-0026654.

(Continued)

*Primary Examiner* — Ida M Soward
(74) *Attorney, Agent, or Firm* — Andrew D. Fortney; Central California IP Group, P.C.

(57) ABSTRACT

A laterally diffused metal oxide semiconductor (LDMOS) device, and a method of manufacturing the same are provided. The LDMOS device can include a drain region of a bootstrap field effect transistor (FET), a source region of the bootstrap FET, a drift region formed between the drain region and the source region, and a gate formed at one side of the source region and on the drift region.

19 Claims, 10 Drawing Sheets

(56) References Cited

U.S. PATENT DOCUMENTS

| | | | |
|---|---|---|---|
| 2004/0256669 A1* | 12/2004 | Hower et al. | 257/335 |
| 2006/0170056 A1* | 8/2006 | Pan et al. | 257/365 |
| 2009/0068804 A1* | 3/2009 | Pendharkar | 438/195 |
| 2009/0258472 A1* | 10/2009 | Florian et al. | 438/424 |
| 2009/0315113 A1* | 12/2009 | Vashchenko | 257/355 |
| 2012/0037984 A1* | 2/2012 | Yu | 257/335 |
| 2013/0069712 A1* | 3/2013 | Trajkovic et al. | 327/537 |
| 2014/0061721 A1* | 3/2014 | Chan et al. | 257/141 |

FOREIGN PATENT DOCUMENTS

| | | |
|---|---|---|
| KR | 1020020013218 | 2/2002 |
| KR | 1020060100160 | 9/2006 |
| KR | 1020110045755 | 11/2012 |

OTHER PUBLICATIONS

Notice of Allowance from Korean Patent Office dated Aug. 14, 2014; (6 pgs.).

Korean Patent Abstract of Publication No. 1020020013218A; Publication Date: Feb. 20, 2002; "High Voltage Semiconductor Device Having High Voltage Isolation Region".

Korean Patent Abstract of Publication No. 1020060100160A; Publication Date: Sep. 20, 2006; "High-Voltage Circuit Device Including Isolation Regions Isolating Low-Voltage Circuit Regions and High-Voltage Circuit Regions".

Korean Patent Abstract of Publication No. 1020120127945A; Publication Date: Nov. 26, 2012; "Manufacture Method for a Lateral Double Diffused Metal Oxide Semiconductor Capable of Reducing On-Resistance".

* cited by examiner (Background Art)

(Background Art)

BOOTSTRAP FIELD EFFECT TRANSISTOR (FET)

CROSS-REFERENCE TO RELATED APPLICATION

This application claims the benefit under 35 U.S.C. §119 of Korean Patent Application No. 10-2013-0026654, filed Mar. 13, 2013, which is hereby incorporated by reference in its entirety.

BACKGROUND

A three-phase gate driver integrated circuit requires three bootstrap diodes to drive a metal oxide semiconductor field effect transistor (MOSFET). Typically, an external bootstrap diode is used during a high voltage process using bulk silicon except for during a silicon on chip (SOC) process.

Recently, a technique embedding an external 700 V bootstrap diode in a chip has been suggested for competitive prices, but when a built-in bootstrap diode is formed, various problems may occur.

FIG. 1 is a cross-sectional view of a related art built-in bootstrap diode. FIG. 2 is a circuit diagram of FIG. 1.

Referring to FIGS. 1 and 2, a related art bootstrap diode includes a P-type semiconductor substrate 1, an N-type epi layer 2, and a first P-TOP 3 stacked with a PNP structure. When forward voltage is applied to the related art bootstrap diode, this PNP structure operates as a first parasitic bipolar junction transistor (BJT) 5. Additionally, the first P-TOP 3, the N-type epi layer 2, and a second P-TOP 4 are formed with a PNP structure in a horizontal direction, so that this operates as a second parasitic BJT 6.

That is, when a built-in bootstrap is implemented in a related art structure, a parasitic transistor operates in a vertical and a horizontal direction, so that a semiconductor device becomes deteriorated and then useless.

BRIEF SUMMARY

Embodiments of the subject invention provide a bootstrap diode, and a method of manufacturing the same, that inhibits the deterioration of device characteristics by firming a parasitic transistor therein while forming the bootstrap diode embedded in a semiconductor chip.

In an embodiment, a laterally diffused metal oxide semiconductor (LDMOS) device can include: a drain region of a bootstrap field effect transistor (FET) to which driving voltage is applied; a source region of the bootstrap FET; a drift region formed between the drain region and the source region; and a gate formed at one side of the source region and on the drift region.

In a further embodiment, the LDMOS device can further include: a second conductive type semiconductor substrate; a first conductive type epitaxial layer on the semiconductor substrate; and a field insulating layer on the first conductive type epitaxial layer. The drain region can include: a first conductive type first buried layer on the semiconductor substrate; a first conductive type first well on the first conductive type first buried layer; and a high concentration first conductive type first connection region in the first conductive type first well. The source region can include: a second conductive type buried layer on the semiconductor substrate; a second conductive type deep well on the second conductive type buried layer; a first conductive type second well and a second conductive type first well in the second conductive type deep well; and a high concentration first conductive type second connection region in the first conductive type second well. The LDMOS device can further include a first P-TOP region in the first conductive type epitaxial layer between the second conducive type deep well and the first conductive type first well.

In another embodiment, a method of manufacturing an LDMOS can include: forming a first conductive type first buried layer and a second conductive type buried layer on a second conductive type semiconductor substrate; forming a first conductive type epitaxial layer on the first conductive type first buried layer and the second conductive type buried layer; forming a second conductive type deep well on the second conductive type buried layer; forming a first P-TOP region in the first conductive type epitaxial layer at one side of the second conducive type deep well; forming a field insulating layer on the first conductive type epitaxial layer; forming a first conductive type first well on the first conductive type first buried layer; forming a drain region comprising a high concentration first conductive type first connection region in the first conductive type first well; forming a first conductive type second well and a second conductive type first well in the second conductive type deep well; forming a source region comprising a high concentration first conductive type second connection region in the first conductive type second well; forming a second P-TOP region at one side of the first conductive type second well; and forming a gate covering a portion of the first P-TOP region and a portion of the second P-TOP region. The P-TOP region can be in the first conductive type epitaxial layer between the second conducive type deep well and the first conductive type first well.

In a further embodiment, the method can further include: forming a first electrode electrically connected to the high concentration first conductive type first connection region of the drain region; forming a second electrode electrically connected to the gate; and forming a third electrode electrically connected to the high concentration first conductive type second connection region of the source region.

DETAILED DESCRIPTION

Reference will now be made in detail to the embodiments of the present disclosure, examples of which are illustrated in the accompanying drawings.

When the terms "on" or "over" are used herein, when referring to layers, regions, patterns, or structures, it is understood that the layer, region, pattern, or structure can be directly on another layer or structure, or intervening layers, regions, patterns, or structures may also be present. When the terms "under" or "below" are used herein, when referring to layers, regions, patterns, or structures, it is understood that the layer, region, pattern, or structure can be directly under the other layer or structure, or intervening layers, regions, patterns, or structures may also be present.

FIGS. 3 to 9 are cross-sectional views showing methods for manufacturing a bootstrap field effect transistor (FET) according to an embodiment of the present invention.

Figure 1:
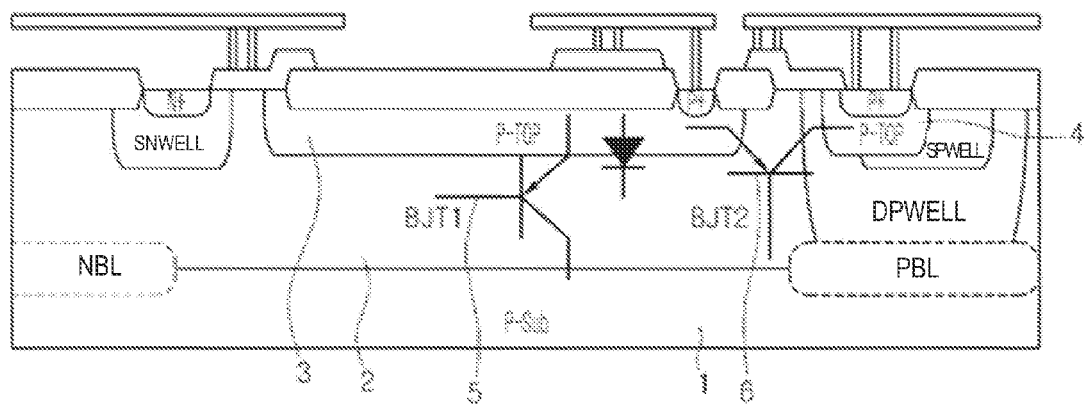
FIG. 1 is a cross-sectional view of a related art built-in bootstrap diode.
Figure 2:
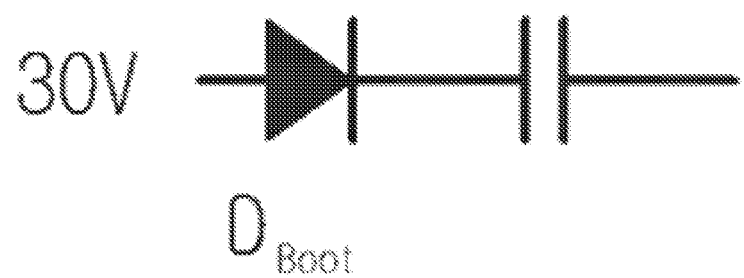
FIG. 2 is a circuit diagram of FIG. 1.
Figure 3:
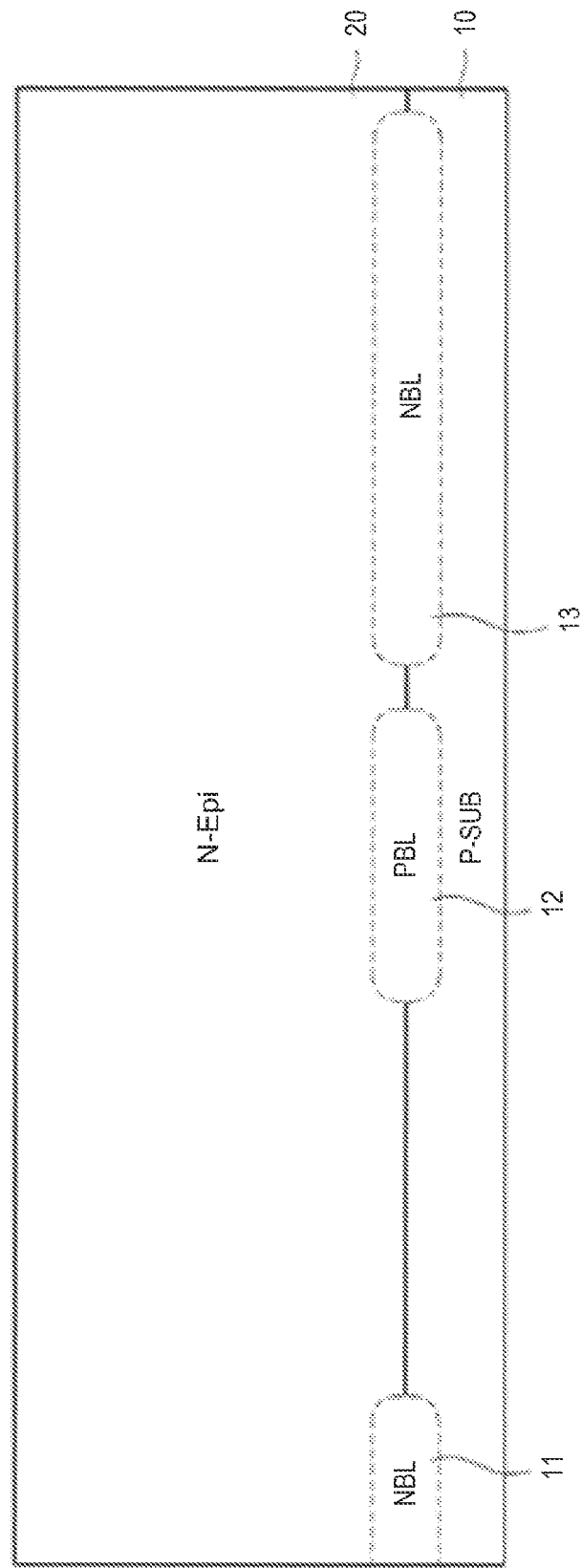
FIG. 3 to 9 are cross-sectional views of a method for manufacturing a bootstrap field effect transistor (FET) according to an embodiment of the subject invention.

Referring to FIG. 3, a first conductive type first buried layer (e.g., N buried layer) 11, a second conductive type buried layer (e.g., P buried layer) 12, and a first conductive type second buried layer (e.g., N buried layer) 13 can be formed on a semiconductor substrate 10 (e.g., a P-type doped semiconductor substrate). The first conductive type can be an N-type and the second conductive type can be a P-type, though embodiments are not limited thereto. For example, the first conductive type can be P-type and the second conductive type can be N-type. Also, though a P-type substrate is shown for exemplary purposes, embodiments are not limited thereto. The first conductive type first buried layer 11, the second conductive type buried layer 12, and the first conductive type second buried layer 13 can be formed by, for example, performing an ion implantation process with a mask formed using a photolithography process, though embodiments are not limited thereto.

A region defining laterally-diffused metal oxide semiconductor (LDMOS), such as an n-type type LDMOS (nLDMOS), can be formed on the conductive type first buried layer 11 and the second conductive type buried layer 12 during a subsequent process. A region defining a diode can be formed on the first conductive type second buried layer 13.

Figure 4:
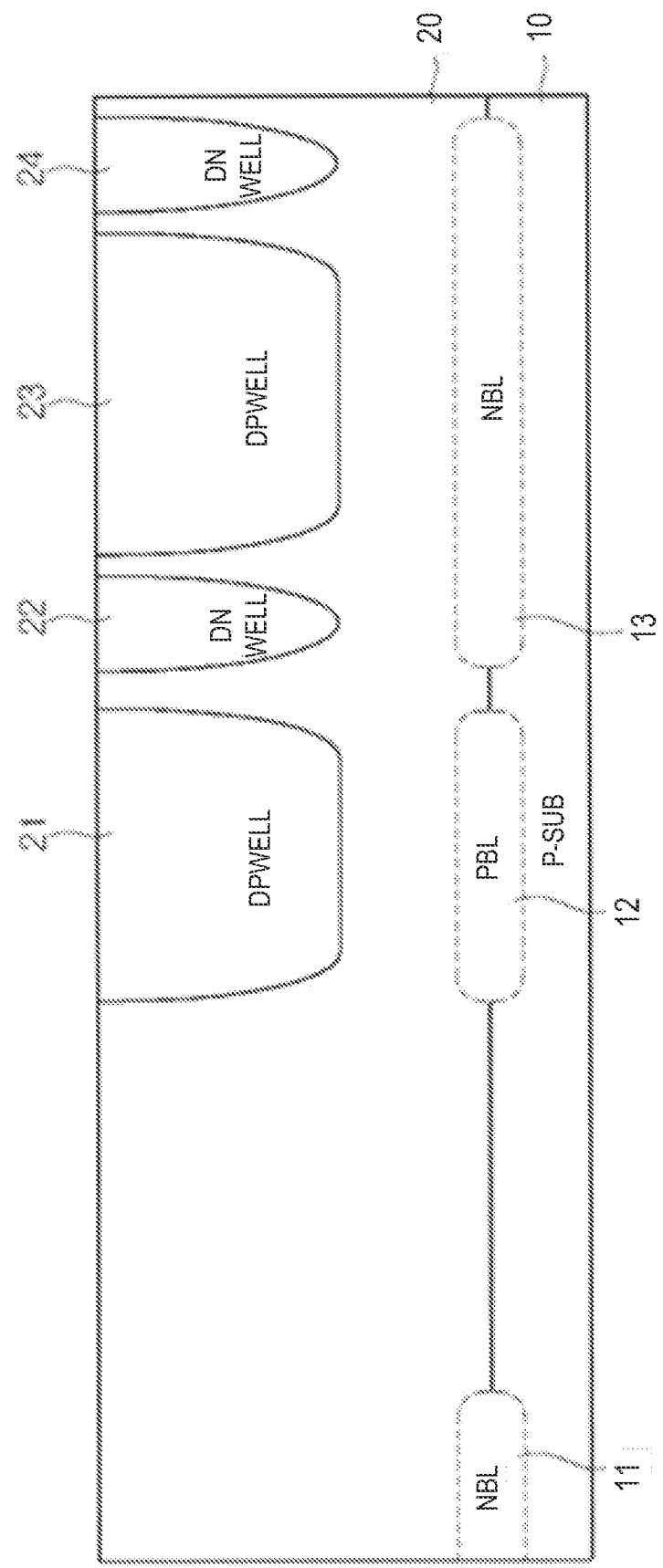

Referring to FIG. 4, a first conductive type epitaxial layer (e.g., an N-EPI layer) 20 can be formed on the semiconductor substrate 10. A second conductive type first deep well (e.g., a DPWELL) 21, a first conductive type first deep well (e.g., a DNWELL) 22, a second conductive type second deep well 23, and a first conductive type second deep well 24 can be formed in the first conductive type epitaxial layer 20.

In an embodiment, a mask (not shown) for forming an active region through photolithography can be formed on the first conductive type epitaxial layer 20, and a process for forming each of the above wells can be performed by ion-implanting an N or P type impurity with the formed mask with high energy.

Figure 5:
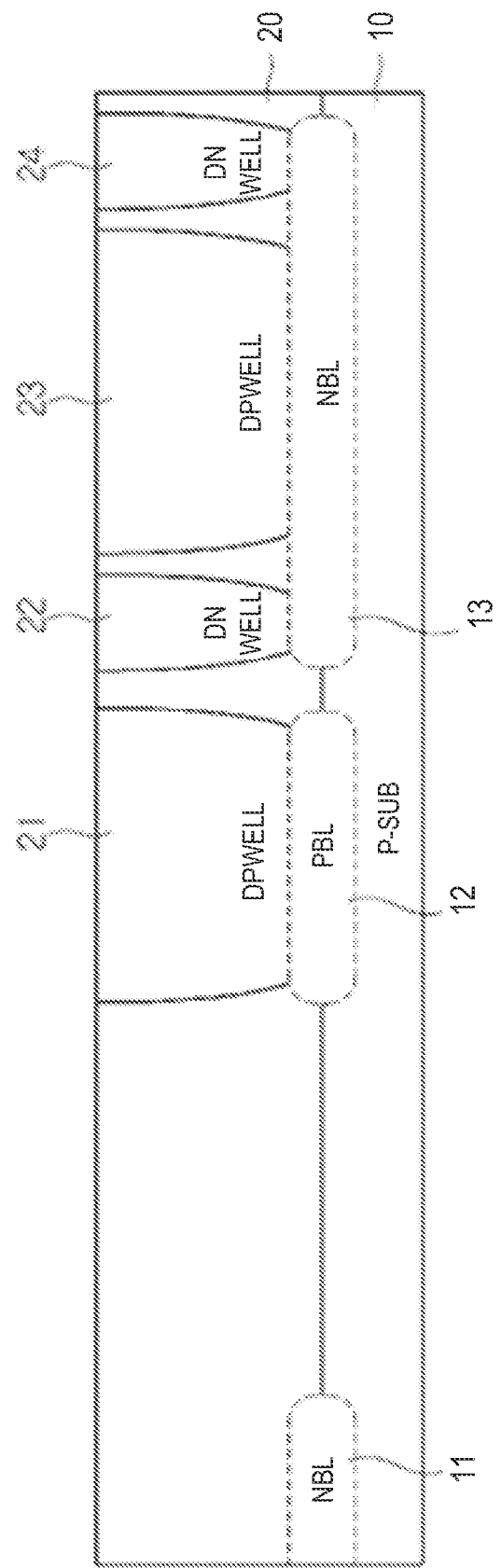
Figure 6:
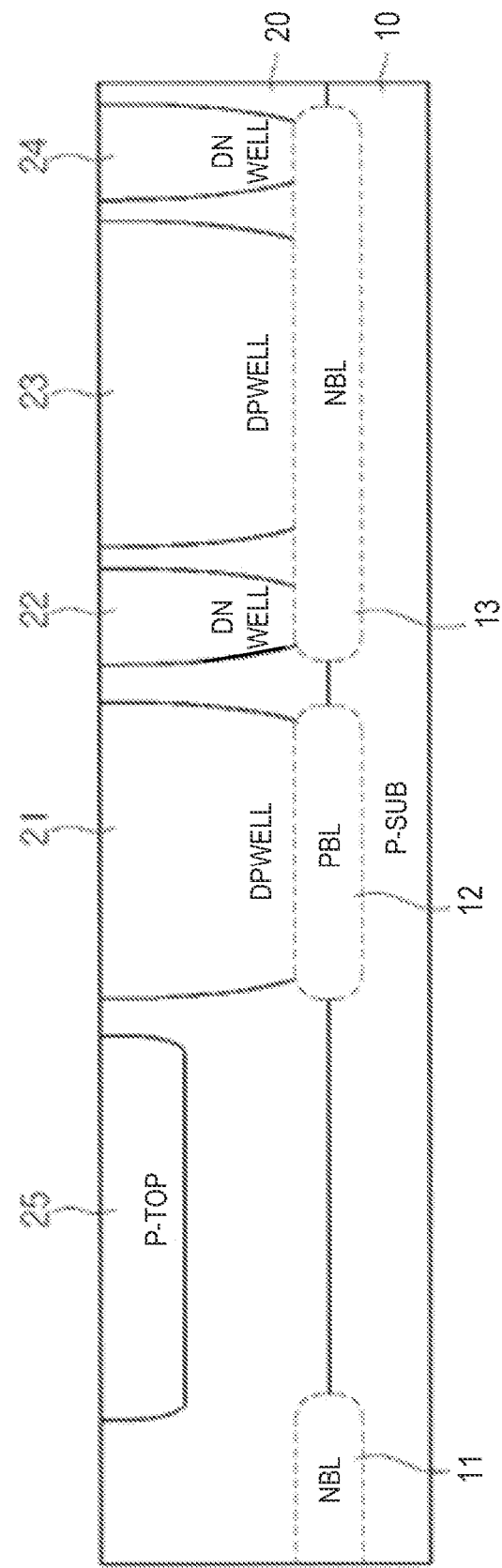

Then, referring to FIG. 5, a thermal process can be performed on the semiconductor substrate 10. Each of the buried layers and deep wells can diffuse so that the deep wells can contact the buried layers therebelow. The second conductive type first deep well 21 can contact the second conductive type buried layer 12 therebelow. The first conductive type first deep well 22, the second conductive type second deep well 23, and the first conductive type second deep well 24 can contact the first conductive type second buried layer 13 therebelow.

Figure 7:
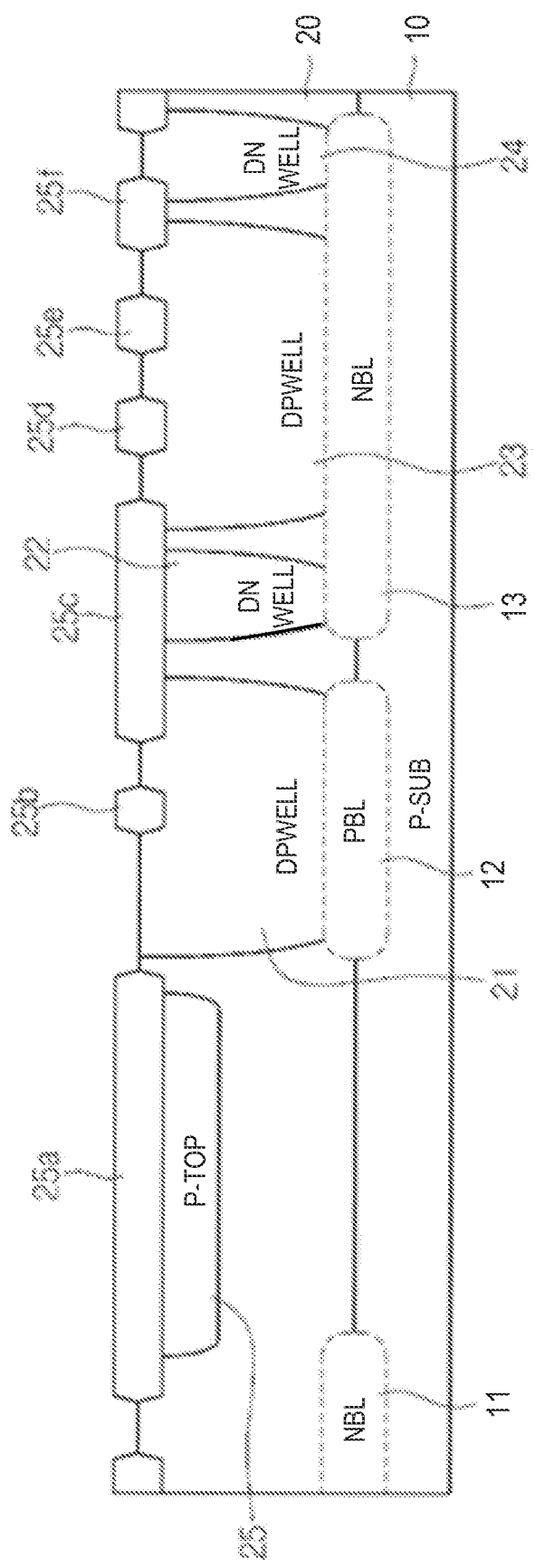

Referring to FIG. 7, the first P-TOP region 25 can be formed on the semiconductor substrate 10. In an embodiment, the first P-TOP region 25 can be formed on the first conductive type epitaxial layer 20 between the first conducive type first buried layer 11 and the second conductive type buried layer 12.

Referring to FIG. 7, in an embodiment, an oxidation process, e.g., local oxidation of silicon (LOCOS), can be performed to form a device isolation layer for defining an active region. The LOCOS process is a process for forming an oxide layer after a hard mask pattern defining an active region is formed. Field insulating layers 25a, 25b, 25c, 25d, 25e, and 25f can be formed on the first conductive type epitaxial layer 20 to isolate each region. In a particular embodiment, the first P-TOP region 25 diffuses by oxidation heat when the oxidation process (e.g., a LOCOS process) is performed, so that it moves below the first conductive type epitaxial layer 20. Though six field insulating layers 25a, 25b, 25c, 25d, 25e, and 25f are shown for exemplary purposes, embodiments are not limited thereto. For example, an oxidation process (e.g., a LOCOS process) can be performed to form one, two, three, four, five, seven, eight, nine, or more field insulating layers on the first conductive type epitaxial layer 20.

Figure 8:
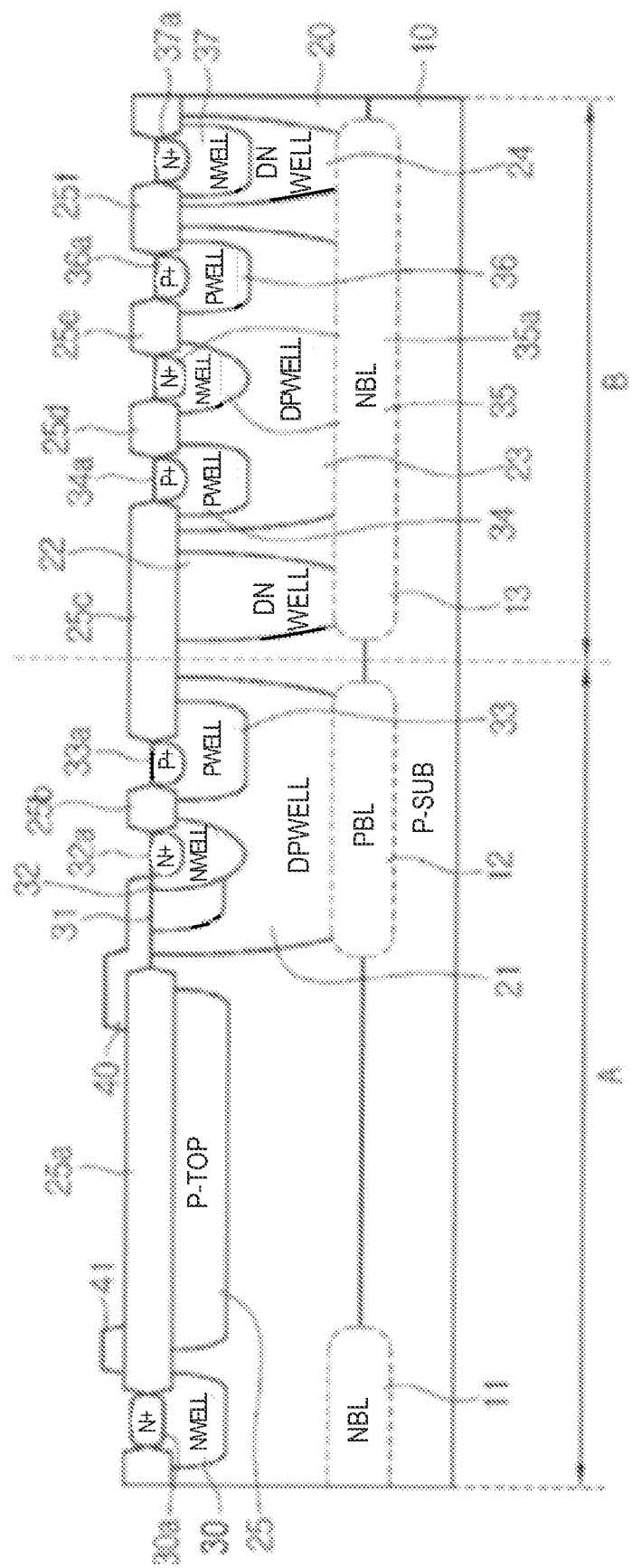

Referring to FIG. 8, an ion implantation process can be performed on a region opened by the field insulating layers 25a, 25b, 25c, 25d, 25e, and 25f formed through the oxidation process, so as to form a P-type or N-type conductive type well.

A first conductive type first well (e.g., an NWELL) 30 can be formed on the first conductive type first buried layer 11, and a first conductive type second well 32 and a second conductive type first well 33 can be formed on the second conductive type buried layer 12. A second P-TOP region 31 can be formed at one side of the first conductive type second well 32. A second conductive type second well 34, a first conductive type third well 35, and a second conductive type third well 36 can be formed by implanting ions in the open region in the second conductive type second deep well 23 contacting the top of the first conductive type second buried layer 13. A first conductive type fourth well 37 can be formed in the first conductive type second deep well 24.

A high concentration conductive type connection region for metal interconnection can be formed on each of the first and second conducive type wells. That is, high concentration first conductive type connection regions 30a, 32a, 35a, and 37a can be formed on the first conductive type wells 30, 32, 35, and 37, respectively, and high concentration second conductive type connection regions 33a, 34a, and 36a can be formed on the second conductive type wells 33, 34, and 36, respectively.

Then, a gate polysilicon 40 can be formed on a field insulating layer 25a on the first P-TOP region 25. The gate polysilicon 40 can be formed to cover a portion of a source region and a portion of the top of the field insulating layer 25a. A poly 41 can be formed at the other side of the top of the field insulating layer 25a in order to form a drain region.

Figure 9:
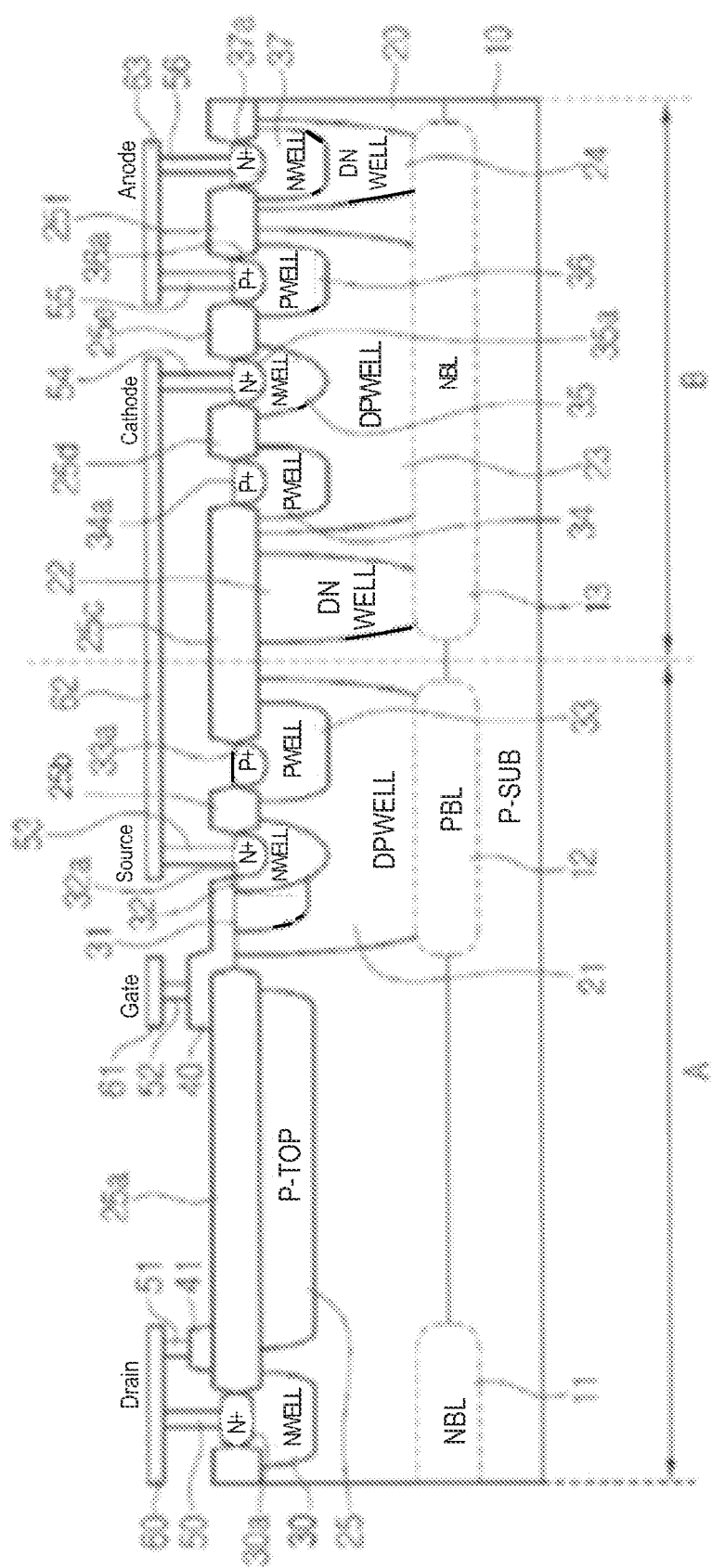

Referring to FIG. 9, a first interconnection 50 and a second interconnection 51 can be formed on the high concentration first conductive type first connection region 30a and the poly 41, respectively, and a first electrode 60 connecting the first 50 and second 51 interconnections can be formed on the first 50 and second 51 interconnections. Thus, the high concentration first conductive type first connection region 30a can be electrically connected to the poly 41 through the first 50 and second 51 interconnections and the first electrode 60. The high concentration first conductive type first connection region 30a can be defined as a drain region, and the first electrode 60 can be defined as a drain electrode.

A third interconnection 52 can be formed on the gate polysilicon 40 at the other side of the field insulating layer 25a connected to the drain region, and a second electrode 61 connected to the third interconnection 52 can be formed on the third interconnection 52. The second electrode 61 can be defined as a gate electrode.

A fourth interconnection 53 can be formed in the high concentration first conductive type second connection region 32a formed in a region opened between the gate polysilicon 40 and the field insulating layer 25b. A third electrode 62 can be firmed on the fourth interconnection 53 and connected to the fourth interconnection 53. The third electrode 62 can be connected to the high concentration first conductive type third connection region 35a. Such a connection can be made via a fifth interconnection 54 formed on the high concentration first conductive type third connection region 35a, under the third electrode 62, and connected to the third electrode 62. Thus, the high concentration first conductive type second connection region 32a can be electrically connected to the high concentration first conductive type third connection region 35a through the fourth 53 and fifth 54 interconnections and the third electrode 62.

A sixth interconnection 55 can be formed on the high concentration second conductive type third connection region 36a, and a seventh interconnection 56 can be formed on the high concentration first conductive type fourth connection region 37a. fourth electrode 63 can be formed on the sixth 55 and seventh 56 interconnections and connecting the sixth 55 and seventh 56 interconnections. Thus, the high concentration second conductive type third connection region 36a can be electrically connected to the high concentration first conductive type fourth connection region 37a through the sixth 55 and seventh 56 interconnections and the fourth electrode 63.

Region A in HG. 9 can be a region where an LDMOS (e.g., an nLDMOS) is formed, and region B can be a region where a diode is formed. The LDMOS (e.g., an nLDMOS) can have a voltage of for example, 700 V, applied to it. The diode can have a voltage of for example, 30 V, applied to it.

Figure 10:
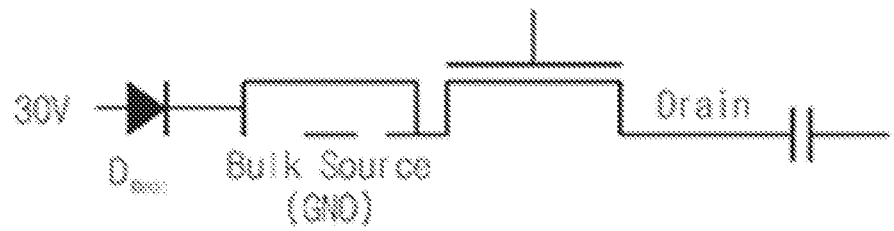
FIG. 10 is a view of an equivalent circuit of a semiconductor device according to an embodiment of the subject invention.

FIG. 10 is a view illustrating an equivalent circuit of a semiconductor device according to an embodiment of the present invention.

Referring to FIG. 10, a bootstrap diode according to an embodiment of the subject invention can have a modularized LDMOS and can include a drain region of a bootstrap FET applied with driving voltage, a source region of a bootstrap FET connected to a bootstrap capacitor, a drift region formed between the drain region and the source region, and a gate formed at one side of the source region and on the drift region.

Figure 11:
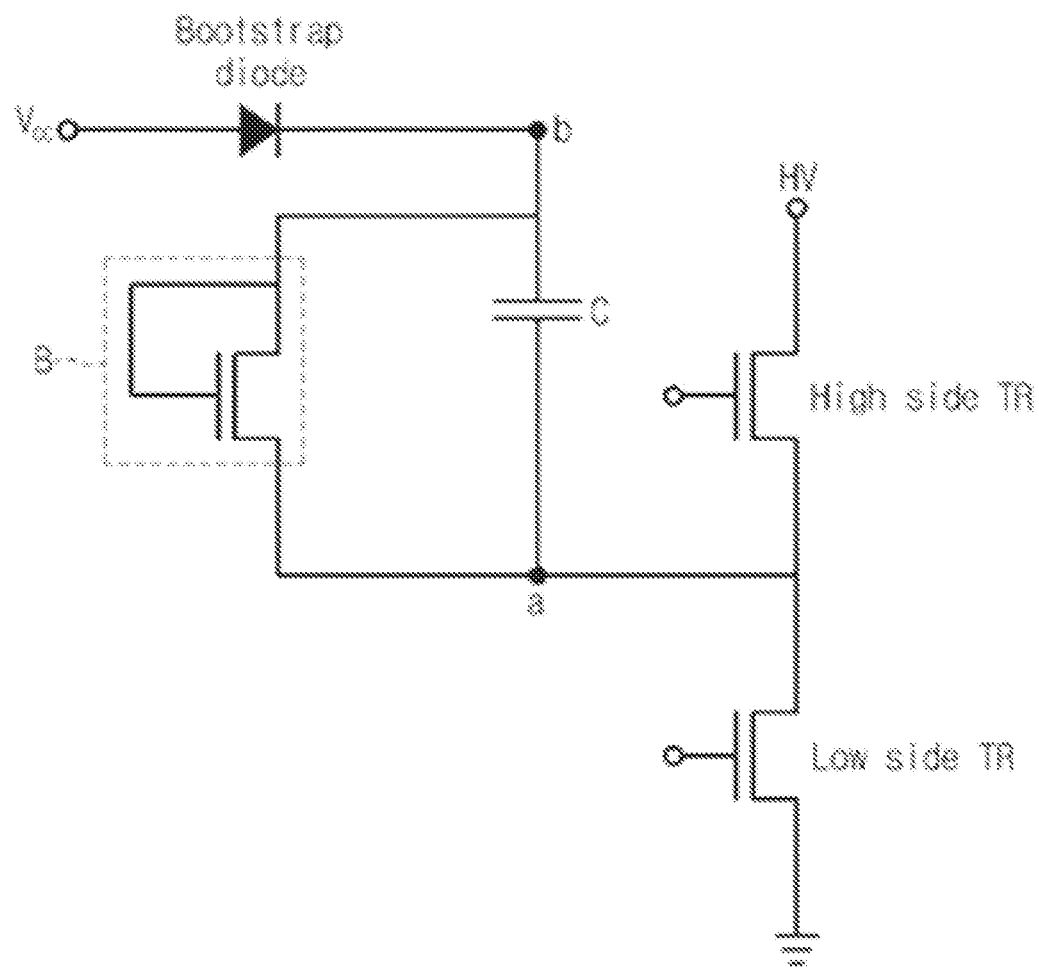
FIG. 11 is a view of a bootstrap circuit according to a related art structure.

FIG. 11 is a view of a bootstrap circuit according to a related art structure.

Referring to FIG. 11, a voltage of less than 15 V is charged in a capacitor when a transistor (TR) in a low voltage region (Low side) is driven, and is used when a TR in a high voltage region (High side) is driven.

As shown in FIG. 11, when the low side TR is turned on, a voltage of a node a becomes 0 V, and a voltage of a node b is charged with about 15 V as forward voltage is applied to a bootstrap diode. Then, when the High side TR is turned on, a voltage of node a becomes about 600 V, and a voltage of about 615 V is applied to the node because the voltage charged in the capacitor is added. At this point, reverse voltage is applied to the bootstrap diode, and the region B inside the dotted line is turned on, so that the capacitor is discharged.

Figure 12:
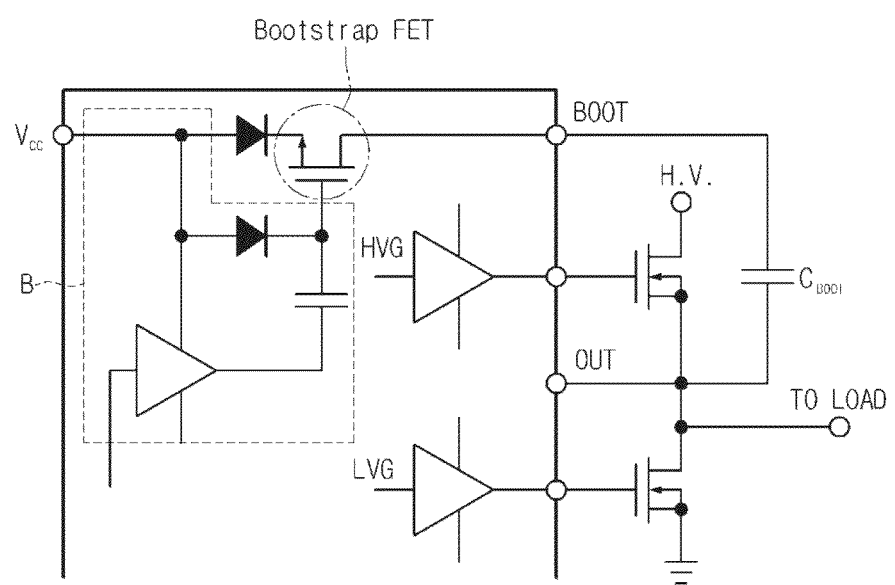
FIG. 12 is a view of a bootstrap circuit according to an embodiment of the subject invention.

FIG. 12 is a view of a bootstrap circuit according to an embodiment of the present invention.

Referring to FIG. 12, a related art bootstrap diode can be improved by adding a bootstrap FET structure, thereby allowing a capacitor to be charged or discharged. That is, when a Low side TR is turned on, Vs is raised from about 0V to about 15 V so that a capacitor is charged, and when a High side TR is turned on, Vb (breakdown voltage) is raised to about 615 V, and thus, the capacitor is discharged. In an LDMOS device according to an embodiment of the present invention, a parasitic transistor can be formed to inhibit the deterioration of a device and maintain high breakdown voltage.

Additionally, according to embodiments of the present invention, a built-in bootstrap diode can be manufactured without an additional mask or an additional process.

Moreover, since a bootstrap FET can be formed in a high voltage junction termination region, a built-in bootstrap diode can be manufactured without increasing a chip size compared to the related art.

Further, by solving problems caused when a related art built-in bootstrap diode is manufactured, compared to an external bootstrap, manufacturing costs can be reduced, and the competitiveness of a semiconductor device used for high voltage can be improved.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

What is claimed is:

1. A laterally diffused metal oxide semiconductor (LDMOS) device, comprising:
    a drain region of a bootstrap field effect transistor (FET);
    a source region of the bootstrap FET;
    a drift region between the drain region and the source region;
    a gate at one side of the source region and on the drift region;
    a first conductive type epitaxial layer on a second conductive type semiconductor substrate having a first P-TOP region between a second conductive type deep well and a first conductive type first well; and
    a field insulating layer on the first conductive type epitaxial layer;
    wherein the drain region comprises (i) a first conductive type first buried layer on the second conductive type semiconductor substrate, (ii) the first conductive type first well on the first conductive type first buried layer; and (iii) a high concentration first conductive type first connection region in the first conductive type first well, and the source region comprises (i) a second conductive type buried layer on the second conductive type semiconductor substrate, (ii) the second conductive type deep well on the second conductive type buried layer, (iii) a first conductive type second well and a second conductive type first well in the second conductive type deep well; and (iv) a high concentration first conductive type second connection region in the first conductive type second well.

2. The LDMOS device according to claim 1, wherein the source region of the bootstrap transistor is connected to a bootstrap capacitor, and a driving voltage is applied to the drain region.

3. The LDMOS device according to claim 1, wherein the drift region comprises a field insulating layer on the first P-TOP region.

4. The LDMOS device according to claim 3, further comprising a second P-TOP region at one end of the gate.

5. The LDMOS device according to claim 1, further comprising a diode electrically connected to the source region.

6. The LDMOS device according to claim 1, wherein the gate is a polysilicon gate.

7. The LDMOS device according to claim 1, wherein the first conductive type is an N-type and the second conductive type is a P-type.

8. The LDMOS device according to claim 1, further comprising:
 a second P-TOP region at one side of the first conductive type second well and under the gate;
 a first electrode electrically connected to the high concentration first conductive type first connection region of the drain region;
 a second electrode electrically connected to the gate; and
 a third electrode electrically connected to the high concentration first conductive type second connection region of the source region.

9. The LDMOS device according to claim 8, further comprising a diode at one side of the source region, wherein the diode comprises:
 a first conductive type second buried layer on the semiconductor substrate;
 a first conductive type first deep well, a second conductive second deep well, and a first conductive type second deep well in the first conductive type epitaxial layer over the first conductive type second buried layer;
 a second conductive type second well, a first conductive type third well, and a second conductive type third well in the second conductive type second deep well;
 a high concentration second conductive type first connection region in the second conductive type second well;
 a high concentration first conductive type third connection region in the first conductive type third well;
 a high concentration second conductive type second connection region in the second conductive type third well; and
 a high concentration first conductive type fourth connection region in the first conductive type second deep well.

10. The LDMOS device according to claim 9, further comprising a fourth electrode electrically connected to the high concentration second conductive type second connection region and the high concentration first conductive type fourth connection region,
 wherein the high concentration first conductive type third connection region is electrically connected to the third electrode.

11. The LDMOS device according to claim 10, wherein the first conductive type is an N-type and the second conductive type is a P-type.

12. The LDMOS device according to claim 1, wherein the drain region, the source region, and the gate form the bootstrap field effect transistor (FET).

13. The LDMOS device according to claim 1, wherein the LDMOS device is an n-type LDMOS (nLDMOS) device.

14. The LDMOS device according to claim 13, wherein the nLDMOS device is on the first conductive type first buried layer and the second conductive type buried layer.

15. The LDMOS device according to claim 1, wherein the first P-TOP region is on the semiconductor substrate.

16. The LDMOS device according to claim 1, wherein the field insulating layer comprises a plurality of local oxidation of silicon (LOCOS) layers.

17. The LDMOS device according to claim 6, wherein the polysilicon gate is in part on the field insulating layer and over the first P-TOP region.

18. The LDMOS device according to claim 1, wherein the gate polysilicon covers a portion of the source region and a portion of the field insulating layer.

19. The LDMOS device according to claim 1, wherein the drain region comprises a polysilicon electrode at a side of the field insulating layer opposite from the polysilicon gate.

* * * * *